US008791471B2

(12) United States Patent
Leung

(10) Patent No.: US 8,791,471 B2
(45) Date of Patent: Jul. 29, 2014

(54) MULTI-CHIP LIGHT EMITTING DIODE MODULES

(75) Inventor: Jacob Chi Wing Leung, Hong Kong (CN)

(73) Assignee: Cree Hong Kong Limited, Shatin, New Terriotories (HK)

( * ) Notice: Subject to any disclaimer, the term of this patent is extended or adjusted under 35 U.S.C. 154(b) by 0 days.

(21) Appl. No.: 12/291,293

(22) Filed: Nov. 7, 2008

(65) Prior Publication Data

US 2010/0117099 A1    May 13, 2010

(51) Int. Cl.
*H01L 33/00* (2010.01)
*H01L 23/48* (2006.01)
*H01L 21/027* (2006.01)

(52) U.S. Cl.
USPC ............................................. 257/88; 257/99

(58) Field of Classification Search
USPC ......... 257/88–93, E33.06, E23.011, E21.023, 257/99
See application file for complete search history.

(56) References Cited

U.S. PATENT DOCUMENTS

| | | | |
|---|---|---|---|
| 3,760,237 A | 9/1973 | Jaffe | ............................ 257/98 |
| 4,307,297 A | 12/1981 | Groff | |
| 4,322,735 A | 3/1982 | Sadamasa et al. | |
| 4,511,425 A | 4/1985 | Boyd | ........................... 156/493 |
| 5,040,868 A | 8/1991 | Waitl | |
| 5,042,048 A | 8/1991 | Meyer | ........................... 372/108 |
| 5,122,943 A | 6/1992 | Pugh | ............................. 362/256 |
| 5,130,761 A | 7/1992 | Tanaka | ........................... 357/17 |
| 5,167,556 A | 12/1992 | Stein | |
| 5,351,106 A | 9/1994 | Lesko et al. | .................... 355/83 |
| 5,703,401 A | 12/1997 | Van De Water | |
| 5,706,177 A | 1/1998 | Nather | |
| 5,731,547 A | 3/1998 | Derwin et al. | ............... 174/251 |
| 5,790,298 A | 8/1998 | Tonar | ............................ 359/267 |
| 5,813,753 A | 9/1998 | Vriens et al. | .................. 362/293 |
| 5,907,151 A | 5/1999 | Gramann | |
| 5,942,770 A | 8/1999 | Ishinaga et al. | ................ 257/89 |

(Continued)

FOREIGN PATENT DOCUMENTS

| | | |
|---|---|---|
| CN | 1274906 A | 11/2000 |
| CN | 2498694 | 7/2002 |

(Continued)

OTHER PUBLICATIONS

Official Notice of Decision for Refusal regarding related Japanese Design Application No. 2009-002857, dated Nov. 17, 2009.

(Continued)

*Primary Examiner* — Long K Tran
*Assistant Examiner* — Jordan Klein
(74) *Attorney, Agent, or Firm* — Koppel, Patrick, Heybl & Philpott

(57) ABSTRACT

A multi-chip lighting module is disclosed for maximizing luminous flux output and thermal management. In one embodiment, a multi-chip module device comprises a substantially thermally dissipative substrate with a dark insulating layer deposited on a surface of the substrate. A plurality of light emitting devices is also provided. An electrically conductive layer is applied to a surface of the substrate, with the conductive layer comprising a plurality of chip carrier parts each having a surface for carrying at least one of the light emitting devices. Each light emitting device has a first and a second electrical terminal. A reflective layer is also provided that at least partially covers the conductive layer.

24 Claims, 6 Drawing Sheets

(56) References Cited

U.S. PATENT DOCUMENTS

| | | | |
|---|---|---|---|
| 5,959,316 A | 9/1999 | Lowery | 257/98 |
| 6,045,240 A * | 4/2000 | Hochstein | 362/294 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 | 10/2001 | Parsons et al. | 362/183 |
| 6,345,903 B1 * | 2/2002 | Koike et al. | 362/241 |
| 6,359,236 B1 | 3/2002 | Distefano et al. | |
| 6,376,902 B1 * | 4/2002 | Arndt | 257/678 |
| 6,447,124 B1 | 9/2002 | Fletcher et al. | 359/604 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima et al. | 362/231 |
| 6,573,580 B2 | 6/2003 | Arndt | |
| 6,610,563 B1 | 8/2003 | Waitl et al. | |
| 6,614,058 B2 | 9/2003 | Lin et al. | |
| 6,621,210 B2 * | 9/2003 | Kato et al. | 313/496 |
| 6,624,491 B2 | 9/2003 | Waitl et al. | |
| 6,680,490 B2 | 1/2004 | Yasukawa et al. | |
| 6,686,580 B1 | 2/2004 | Glenn et al. | 250/208.1 |
| 6,686,609 B1 | 2/2004 | Sung | |
| 6,700,136 B2 | 3/2004 | Guida | 257/79 |
| 6,707,069 B2 * | 3/2004 | Song et al. | 257/79 |
| 6,710,373 B2 | 3/2004 | Wang | |
| 6,717,353 B1 | 4/2004 | Mueller et al. | 313/501 |
| 6,759,733 B2 * | 7/2004 | Arndt | 257/672 |
| 6,765,235 B2 | 7/2004 | Taninaka et al. | 257/88 |
| 6,770,498 B2 | 8/2004 | Hsu | 438/26 |
| 6,774,401 B2 | 8/2004 | Nakada et al. | |
| 6,791,259 B1 | 9/2004 | Stokes | |
| 6,809,342 B2 | 10/2004 | Harada | 257/79 |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | 257/99 |
| 6,919,586 B2 | 7/2005 | Fujii | |
| 6,940,704 B2 | 9/2005 | Stalions | |
| 6,946,714 B2 | 9/2005 | Waitl | |
| 6,964,877 B2 | 11/2005 | Chen et al. | 438/20 |
| 6,975,011 B2 | 12/2005 | Arndt et al. | |
| 6,995,510 B2 | 2/2006 | Murakami et al. | |
| D517,025 S | 3/2006 | Asakawa | D13/180 |
| 7,009,627 B2 | 3/2006 | Abe et al. | 345/690 |
| 7,015,514 B2 * | 3/2006 | Baur et al. | 257/100 |
| 7,021,797 B2 | 4/2006 | Minano et al. | 362/355 |
| 7,064,907 B2 | 6/2006 | Kaneko | |
| 7,066,626 B2 * | 6/2006 | Omata | 362/257 |
| 7,102,213 B2 | 9/2006 | Sorg | |
| 7,119,422 B2 | 10/2006 | Chin | 257/666 |
| 7,161,189 B2 | 1/2007 | Wu | 257/98 |
| 7,187,009 B2 * | 3/2007 | Fukasawa et al. | 257/98 |
| 7,224,000 B2 | 5/2007 | Aanegola et al. | 257/98 |
| 7,244,965 B2 * | 7/2007 | Andrews et al. | 257/98 |
| 7,282,740 B2 * | 10/2007 | Chikugawa et al. | 257/79 |
| 7,285,802 B2 | 10/2007 | Ouderkirk et al. | 257/98 |
| 7,303,315 B2 * | 12/2007 | Ouderkirk et al. | 362/294 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,429,757 B2 * | 9/2008 | Oyama et al. | 257/98 |
| 7,579,628 B2 | 8/2009 | Inoguchi | 257/81 |
| 7,622,795 B2 * | 11/2009 | Chiang | 257/675 |
| 7,635,915 B2 | 12/2009 | Xie et al. | 257/692 |
| 7,692,206 B2 * | 4/2010 | Loh | 257/99 |
| 7,777,412 B2 | 8/2010 | Pang | 313/506 |
| 7,847,302 B2 | 12/2010 | Basin et al. | 257/88 |
| 7,875,899 B2 | 1/2011 | Yasuda | 257/99 |
| 7,919,339 B2 * | 4/2011 | Hsu | 438/28 |
| 7,923,831 B2 | 4/2011 | Ng | 257/692 |
| 8,217,414 B2 | 7/2012 | Hayashi | 257/99 |
| 8,324,654 B2 * | 12/2012 | An et al. | 257/99 |
| 2002/0030194 A1 | 3/2002 | Camras et al. | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0195935 A1 | 12/2002 | Jager | |
| 2003/0116769 A1 | 6/2003 | Song et al. | |
| 2003/0160256 A1 * | 8/2003 | Durocher et al. | 257/88 |
| 2003/0183852 A1 | 10/2003 | Takenaka | |
| 2004/0016938 A1 | 1/2004 | Baretz et al. | 257/100 |
| 2004/0037076 A1 | 2/2004 | Katoh et al. | 362/235 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0090174 A1 | 5/2004 | Tasch et al. | |
| 2004/0126913 A1 | 7/2004 | Loh | |
| 2004/0217364 A1 | 11/2004 | Tarsa | |
| 2004/0227149 A1 | 11/2004 | Ibbetson | |
| 2004/0232435 A1 | 11/2004 | Hofer | |
| 2004/0238930 A1 | 12/2004 | Arndt | |
| 2004/0256706 A1 | 12/2004 | Nakashima | |
| 2005/0023548 A1 | 2/2005 | Bhat | |
| 2005/0072981 A1 | 4/2005 | Suenaga | |
| 2005/0077535 A1 | 4/2005 | Li | |
| 2005/0082574 A1 | 4/2005 | Tasch et al. | |
| 2005/0093005 A1 | 5/2005 | Ruhnau | |
| 2005/0110033 A1 | 5/2005 | Heremans et al. | 257/98 |
| 2005/0116235 A1 * | 6/2005 | Schultz et al. | 257/79 |
| 2005/0117320 A1 | 6/2005 | Leu et al. | |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0156187 A1 | 7/2005 | Isokawa | |
| 2005/0179041 A1 | 8/2005 | Harbers et al. | |
| 2005/0179376 A1 | 8/2005 | Fung et al. | |
| 2005/0199899 A1 | 9/2005 | Lin et al. | 257/99 |
| 2005/0231983 A1 | 10/2005 | Dahm | |
| 2005/0253130 A1 | 11/2005 | Tsutsumi et al. | 257/13 |
| 2005/0286581 A1 * | 12/2005 | Shinohara et al. | 372/43.01 |
| 2006/0022212 A1 | 2/2006 | Waitl | |
| 2006/0049477 A1 | 3/2006 | Arndt | |
| 2006/0060867 A1 | 3/2006 | Suehiro | 257/81 |
| 2006/0091406 A1 | 5/2006 | Kaneko et al. | 257/81 |
| 2006/0102917 A1 | 5/2006 | Oyama et al. | |
| 2006/0105478 A1 | 5/2006 | Camras et al. | |
| 2006/0108594 A1 | 5/2006 | Iwasaki et al. | |
| 2006/0131591 A1 | 6/2006 | Sumitani | |
| 2006/0133044 A1 | 6/2006 | Kim et al. | |
| 2006/0151809 A1 | 7/2006 | Isokawa | |
| 2006/0157828 A1 | 7/2006 | Sorg | |
| 2006/0220046 A1 | 10/2006 | Yu et al. | |
| 2006/0267031 A1 | 11/2006 | Tasch et al. | |
| 2006/0267042 A1 | 11/2006 | Izuno et al. | 257/100 |
| 2006/0278882 A1 | 12/2006 | Leung et al. | 257/98 |
| 2006/0291185 A1 | 12/2006 | Atsushi | 362/29 |
| 2007/0046176 A1 | 3/2007 | Bukesov et al. | |
| 2007/0096139 A1 | 5/2007 | Schultz | |
| 2007/0109779 A1 | 5/2007 | Sekiguchi et al. | |
| 2007/0145401 A1 | 6/2007 | Ikehara | |
| 2007/0170449 A1 | 7/2007 | Anandan | |
| 2007/0241357 A1 | 10/2007 | Yan | 257/98 |
| 2007/0262328 A1 | 11/2007 | Bando | |
| 2007/0269586 A1 | 11/2007 | Leatherdale | |
| 2007/0295975 A1 | 12/2007 | Omae | 257/89 |
| 2008/0013319 A1 | 1/2008 | Pei et al. | |
| 2008/0026498 A1 | 1/2008 | Tarsa et al. | 438/26 |
| 2008/0074032 A1 | 3/2008 | Yano et al. | 313/503 |
| 2008/0093606 A1 | 4/2008 | Pan et al. | |
| 2008/0121921 A1 | 5/2008 | Loh et al. | |
| 2008/0149960 A1 | 6/2008 | Amo et al. | 257/98 |
| 2008/0170391 A1 | 7/2008 | Norfidathul et al. | 362/227 |
| 2008/0186702 A1 | 8/2008 | Camras et al. | |
| 2008/0191232 A1 | 8/2008 | Lee et al. | |
| 2008/0198594 A1 | 8/2008 | Lee | |

(56) References Cited

U.S. PATENT DOCUMENTS

| | | | |
|---|---|---|---|
| 2008/0230790 A1 | 9/2008 | Seko et al. | |
| 2008/0258156 A1 | 10/2008 | Hata | 157/88 |
| 2008/0296590 A1 | 12/2008 | Ng | 257/88 |
| 2008/0303052 A1 | 12/2008 | Lee et al. | |
| 2008/0308825 A1 | 12/2008 | Chakraborty | |
| 2009/0020774 A1* | 1/2009 | Park | 257/98 |
| 2009/0050908 A1 | 2/2009 | Yuan et al. | |
| 2009/0050911 A1 | 2/2009 | Chakraborty | |
| 2009/0057699 A1 | 3/2009 | Basin | |
| 2009/0057708 A1 | 3/2009 | Abdul Karim et al. | 257/100 |
| 2009/0072251 A1 | 3/2009 | Chan et al. | 257/89 |
| 2009/0095966 A1 | 4/2009 | Keller et al. | 257/98 |
| 2009/0129085 A1 | 5/2009 | Aizar et al. | 362/247 |
| 2009/0189178 A1 | 7/2009 | Kim et al. | |
| 2009/0283781 A1 | 11/2009 | Chan et al. | |
| 2010/0044735 A1 | 2/2010 | Oyamada | |
| 2010/0103660 A1 | 4/2010 | Van de Ven et al. | 362/231 |
| 2010/0193822 A1 | 8/2010 | Inobe et al. | 257/98 |
| 2011/0049545 A1 | 3/2011 | Basin et al. | 257/98 |
| 2011/0108874 A1 | 5/2011 | Chu et al. | |
| 2011/0121345 A1 | 5/2011 | Andrews et al. | |
| 2011/0186880 A1 | 8/2011 | Kohler et al. | 257/91 |
| 2011/0193118 A1 | 8/2011 | Oshima et al. | |
| 2011/0278617 A1 | 11/2011 | Lee | |
| 2012/0235199 A1 | 9/2012 | Andrews et al. | |
| 2012/0257386 A1 | 10/2012 | Harbers et al. | 362/235 |

FOREIGN PATENT DOCUMENTS

| | | |
|---|---|---|
| CN | 2549313 | 5/2003 |
| CN | 2617039 Y | 5/2004 |
| CN | 2646873 | 10/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1801498 A | 7/2006 |
| CN | 1874011 A | 12/2006 |
| CN | 1913135 A | 2/2007 |
| CN | 1977399 A | 6/2007 |
| CN | 101005109 A | 7/2007 |
| CN | 101013689 | 8/2007 |
| CN | 101061590 A | 10/2007 |
| CN | 101360368 | 2/2009 |
| DE | WO 9931737 | 6/1999 |
| DE | WO 2004027882 | 1/2004 |
| DE | 202007012162 | 4/2008 |
| EP | 1005085 A2 | 5/2000 |
| EP | 1187226 A1 | 3/2002 |
| EP | 1187227 | 3/2002 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1653254 A2 | 5/2006 |
| EP | 1864780 | 12/2007 |
| EP | 1 953 834 A1 | 8/2008 |
| GB | 2420221 A | 12/2004 |
| GB | 2420221 A | 5/2006 |
| GB | 2 458 972 A | 10/2009 |
| GB | 2466633 A | 7/2010 |
| JP | 53-118019 | 10/1978 |
| JP | S53118019 | 10/1978 |
| JP | S53126570 | 10/1978 |
| JP | 59-027559 A | 2/1984 |
| JP | 59027559 | 2/1984 |
| JP | 61-048951 A | 3/1986 |
| JP | 6148951 | 3/1986 |
| JP | 61048951 | 3/1986 |
| JP | S62160564 | 3/1986 |
| JP | 62047156 | 2/1987 |
| JP | 62140758 | 9/1987 |
| JP | 038459 | 1/1991 |
| JP | 03-171780 | 7/1991 |
| JP | 06-177424 | 6/1994 |
| JP | 7-202271 A | 8/1995 |
| JP | 07202271 | 8/1995 |
| JP | 2006019557 | 1/1996 |
| JP | 08032120 | 2/1996 |
| JP | 61048951 | 3/1996 |
| JP | 8139257 | 5/1996 |
| JP | 10321909 | 12/1998 |
| JP | 11008405 | 1/1999 |
| JP | 11-054802 | 2/1999 |
| JP | 11-167805 A | 6/1999 |
| JP | 11150306 | 6/1999 |
| JP | 11261113 | 9/1999 |
| JP | 2000-188358 | 7/2000 |
| JP | 2000-223751 | 8/2000 |
| JP | 2000223752 | 8/2000 |
| JP | 2000261041 | 9/2000 |
| JP | 2001044506 | 2/2001 |
| JP | 2001-168400 | 6/2001 |
| JP | 2001237463 | 8/2001 |
| JP | 2001518692 | 10/2001 |
| JP | 2002009217 | 1/2002 |
| JP | 2002-223005 | 8/2002 |
| JP | 2002374005 | 12/2002 |
| JP | 2003-197974 | 7/2003 |
| JP | 2003-264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004-111937 A | 4/2004 |
| JP | 2004146815 | 5/2004 |
| JP | 2004-200236 | 7/2004 |
| JP | 2004228387 | 8/2004 |
| JP | 2004335740 | 11/2004 |
| JP | 2004335880 | 11/2004 |
| JP | 2005-019838 A | 1/2005 |
| JP | 2005019838 | 1/2005 |
| JP | 2005-079167 | 3/2005 |
| JP | 2005150624 | 6/2005 |
| JP | 2005-310935 | 11/2005 |
| JP | 2005347401 | 12/2005 |
| JP | 2005539386 | 12/2005 |
| JP | 2006508537 | 3/2006 |
| JP | 2006509372 A | 3/2006 |
| JP | 2006108517 | 4/2006 |
| JP | 2006-119357 | 5/2006 |
| JP | 2006-324331 | 11/2006 |
| JP | 2006344692 | 12/2006 |
| JP | 2007-094088 | 4/2007 |
| JP | 2007509505 | 4/2007 |
| JP | 2007-165029 | 6/2007 |
| JP | 2007165840 | 6/2007 |
| JP | 2007184542 | 7/2007 |
| JP | 2007243226 | 9/2007 |
| JP | 2007-273763 | 10/2007 |
| JP | 2007-287981 | 11/2007 |
| JP | 2007-299905 | 11/2007 |
| JP | 2007317896 | 12/2007 |
| JP | 2007329516 | 12/2007 |
| JP | 2008521236 | 6/2008 |
| RU | 2251761 | 2/2005 |
| WO | WO 0217405 | 2/2002 |
| WO | WO 03049204 | 6/2003 |
| WO | WO 2004003660 | 4/2004 |
| WO | WO2004044877 | 5/2004 |
| WO | WO 2004/053933 A2 | 6/2004 |
| WO | WO2005043627 A1 | 5/2005 |
| WO | WO 2005104247 | 11/2005 |
| WO | WO 2006016398 | 2/2006 |
| WO | WO 2006054228 | 5/2006 |
| WO | WO 2006054228 A2 | 5/2006 |
| WO | WO 2006054228 A3 | 5/2006 |
| WO | WO 2006054228 | 6/2006 |
| WO | WO 2006135502 | 12/2006 |
| WO | WO 2007/083408 A1 | 7/2007 |

(56) References Cited

FOREIGN PATENT DOCUMENTS

| WO | WO 2007121486 A2 | 10/2007 |
|---|---|---|
| WO | WO2007/127029 A2 | 11/2007 |
| WO | WO 2007122516 | 11/2007 |
| WO | WO 2008081794 A1 | 7/2008 |
| WO | WO 2008082098 | 7/2008 |
| WO | WO 2009/074919 A1 | 6/2009 |
| WO | WO 2010005294 | 1/2010 |
| WO | WO 2012099145 A1 | 7/2012 |

OTHER PUBLICATIONS

Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
JP 2001 060072A , Abstract, Matsushita Electric Ind. Co Ltd., Mar. 6, 2001.
Office Action from related China Application No. 200710142310.7, dated: Dec. 11, 2009.
Declaration of Gerald Negley under 37 C.F.R.§ 1.132, dated: Aug. 20, 2009.
Declaration of Charles Swoboda under 37 C.F.R.§ 1.132, dated: Aug. 19, 2009.
(From Related Chinese Application): Chinese Application No. 200710142310.7 dated Dec. 11, 2009.
International Search Report for PCT/CN2009/074800 mailed Feb. 25, 2010.
Preliminary Notice of Reasons for Refusal re related Japanese Application No. 2009-002857, dated: Apr. 24, 2009, pp. 1-2.
Preliminary Notice of Reasons for Refusal re related Japanese Application No. 2009-002857, dated: Jul. 24, 2009.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 12/154,691, dated: Dec. 17, 2009.
Response to Office Action from U.S. Appl. No. 12/154,691, dated: May 17, 2010.
Office Action from U.S. Appl. No. 11/465,120. dated: Mar. 9, 2010.
Office Action from U.S. Appl. No. 12/152,766. dated: Mar. 12, 2010.
Office Action from U.S. Appl. No. 12/069,827, dated: Apr. 20, 2010.
Office Action from U.S. Appl. No. 12/321,059, dated: May 17, 2010.
Office Action from U.S. Appl. No. 11/149,998, dated: May 18, 2010.
First Office Action for Chinese Patent Application No. 200780019643.9 dated Mar. 29, 2010.
Appeal Decision in Japanese Design Patent Application No. 2009-002857 (Appeal No. 2010-002154) mailed Aug. 20, 2010.
Notification of First Office Action in application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
CREE® XLAMP® MC-E LEDS Product Info Sheets, pp. 1-3.
Nichia Corporation LEDS, Models NSSM016G, NSSM227, NESM026X, NSSM026BB, NESM005A, 9 Pages.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
Office Action from U.S. Appl. No. 11/465,120, dated: Jun. 14, 2011.
Office Action from U.S. Appl. No. 12/069,827. dated: Jun. 16, 2011.
Response to Office Action from U.S. Appl. No. 12/069,827, filed Aug. 3, 2011.
Office Action from U.S. Appl. No. 12/321,059. dated: Jun. 22, 2011.
Response to Office Action from U.S. Appl. No. 12/321,059, filed Aug. 22, 2011.
Office Action from U.S. Appl. No. 12/321,059, dated: Aug. 26, 2011.
Response to Office Action from U.S. Appl. No. 12/321,059, filed Sep. 20, 2011.
Office Action from U.S. Appl. No. 11/496,922, dated: Jul. 5, 2011.
Office Action from U.S. Appl. No. 12/695,978. dated: Sep. 14, 2011.
Office Action from U.S. Appl. No. 11/149,998, dated: Sep. 21, 2011.
Office Action from U.S. Appl. No. 12/321,059. dated: Oct. 4, 2011.
First Office Action for Chinese Patent Application No. CN 200710152109.7 issued Jul. 29, 2011.
Decision of Rejection for Japanese Patent Application No. 2007-211901, dated: Jan. 30, 2012.

(56) References Cited

OTHER PUBLICATIONS

Extended Supplementary European Search Report for application No. EP 07789665.2 dated Nov. 7, 2011.
Second Office Action for Chinese Patent Application No. CN200880009255.7 mailed Oct. 13, 2011.
International Search Report and Written Opinion for PCT Application No. PCT/US2011/001457 mailed Dec. 13, 2011.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from Application No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. 11/982,275, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
First Office Action for Chinese Patent Application No. 201110039138.9, dated Jun. 4, 2012.
Decision of Rejection from Japanese Patent Application No. 2008-515699, dated Jul. 17, 2012.
Interrogation from Japanese Patent Application No. 2007-211901. dated Aug. 21, 2012.
Examination Report from European Patent Application No. 07789665.2, dated Aug. 20, 2012.
Decision of Rejection from Chinese Patent Application No. 200880009255,7. dated Sep. 5, 2012.
Notice of Reasons for Rejection from Japanese Patent Application No. 2009-507195. dated May 8. 2012.
First Office Action for Chinese Patent Application No. 200980153995.2 , dated May 4, 2012.
First Office Action for Chinese Patent Application No. 200910145412.3. dated Apr. 28, 2012.
First Office Action from Chinese Patent Application No. 201080001658.9, dated Sep. 24, 2012.
Notification of the First Office Action from Chinese Patent Application No. 201010167346.2, dated Feb. 29, 2012.
Notification of the Second Office Action from Chinese Patent Application No. 201010167346.2, dated Feb. 17, 2013.
Third Office Action from Chinese Patent Application No. 200710152109.7. dated: Mar. 5, 2013.
Interrogation from Japanese Patent Application No. 2008-515699, dated Feb. 19, 2013.
Communication from European Patent Appl. No 09824413.0-1551, dated Feb. 28. 2013.
European Search Report from European Patent Appl. No. 09824413.0-1551, dated Feb. 11, 2013.
Notice of Reasons for Rejection from Japanese Patent Appl. No. 2011-534993, dated Mar. 12, 2013.
Decision of Rejection from Japanese Patent Application No. 2009-507195, dated May 21, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Second Office Action from Chinese Patent Appl. No. 201110339138.9, dated Jan. 31, 2013.
International Search Report and Written Opinion from PCT application No. PCT/US2012/065060, dated Feb. 20, 2013.
Extended Search Report for European Patent Application No. 09824413.0-1551, dated Feb. 11, 2013.
Notice of Reasons for Rejection from Japanese Patent Application No. 2007-211901, dated Apr. 9, 2013.
Decision of Rejection from Japanese Patent Application No. 2011-545616. dated Apr. 26, 2013.
Office Action from Japanese Patent Appl. No. 2012-288000, dated Oct. 8, 2013.
Decision of Rejection from Chinese Patent Appl. No. 201110039138.9 dated Sep. 25, 2013.
Appeal Decision from Japanese Patent Appl No. 2008-515699. dated Sep. 20, 2013.
Decision of Rejection from Chinese Patent Appl. No. 201001067346.2, dated Aug. 30, 2013.
Fourth Office Action from Chinese Patent Appl. No. 200710152109.7, dated Jun. 28, 2013.
Decision of Rejection from Chinese Patent Appl. No. 201080001658.4, dated Jun. 20, 2013.
Office Action from U.S. Appl. No. 12/868,567. dated Jul. 5, 2013.
Office Action from U.S. Appl. No, 12/875,873, dated Jul. 3, 2013.
Office Action from U.S. Appl. No. 11/496,922, dated Jun. 26, 2013.
Office Action from U.S. Appl. No. 12/757,891. dated Jun. 18, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No, 12/868,567, filed Jan. 14, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002.,410. dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120. dated Aug. 21, 2012.
Response to OA from U.S. Appl. No. 11/465,120, filed Aug. 24, 2012.
Office Action from U.S. Appl. No. 12/875,873. dated Aug. 22, 2012.
Response to OA from U.S. Appl. No. 12/875,873, filed Nov. 19, 2012.
Office Action from U.S. Appl. No. 11/465,120. dated Jun. 19, 2012.
Response to OA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action U.S. Appl. No. 12/757,179. dated Jul. 16, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589. dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to CA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/695,978. dated Apr. 18, 2013.
Response to OA from U.S. Appl. No. 12/695,978, filed Jul. 10, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/695,978. dated Sep. 17, 2013.
Office Action from U.S. Appl. No. 13/652,241. dated Sep. 11, 2013.
Office Action from U.S. Appl. No. 12/002,410. dated Sep. 10, 2013.

(56) References Cited

OTHER PUBLICATIONS

Notice of Reasons for Rejection from Japanese Patent Appl. No. 2007-211901, dated Oct. 8, 2013.
Notification of Loss of Rights from European Patent Appl. No. 09824413.0. dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 11/496,922. dated Oct. 9, 2013.
Office Action from U.S. Appl. No. 12/875,873, dated Oct. 18, 2013.
Fifth Office Action from Chinese Patent Appl. No. 2007/10152109.7, dated Jan. 6, 2014.
Supplemental European Search Report from European Patent Appl. No. 10731037.7, dated Jan. 9, 2014.
Interrogation from Japanese Patent Appl. No. 2009-507195. dated Jan. 28, 2014.
Notification of Designation of the Appeal Examiner from Japanese Patent Appl. No. 2009-507195, dated Jan. 22, 2014.
Interrogation from Japanese Patent Appl. No. 2008-281533. dated Jan. 21, 2014.
International Search Report and Written Opinion from PCT/US2013/073921, dated Feb. 18, 2014.
Decision of Registration from Japanese Design Appl. No. 2012-030304. dated Jan. 21, 2014.
Office Action from U.S. Appl. No. 12/757,891, dated Jan. 14, 2014.
Office Action from U.S. Appl No 12/695,978. dated Jan. 31, 2014.
Office Action from U.S. Appl. No. 12/002,410, dated Feb. 4, 2014.
Search Report for European Patent Appl. No. 10731037.7, dated Dec. 11, 2013.
Notice of Reasons for Rejection from Japanese Patent Appl. No. 2011-534993. dated Nov. 12, 2013.
Decision of Re-Examination from Chinese Patent Appl. No. 201110039138.9. dated Mar. 13. 2014.
First Office Action from Chinese Patent Appl. No. 201080027586.0. dated Feb, 8. 2014.
Decision of Rejection from Japanese Patent Appl. No. 2011-259253, dated Mar. 25, 2014.
Office Action from U.S. Appl. No. 12/875,873, dated Feb. 25, 2014.
Office Action from U.S. Appl. No. 13/652,241, dated Mar. 12, 2014.
Office Action from U.S. Appl. No. 12/069,827, dated Apr. 1, 2014.
Office Action from Russian Patent Appl. No. 2011146934/28, dated Feb. 28, 2014.
Second Office Action from Chinese Patent Appl. No. 201210046248.2. dated Apr. 15, 2014.
Partial European Search Report from European Patent Appl. No. 08253519.6-1564, dated Apr. 29, 2014.
Examination from European Patent Appl. No. 09 824 413.0-1551, dated May 16. 2014.
Notification of Reexamination from Chinese Patent Appl No. 2008800092557, dated May 12, 2014.
Decision on Rejection from Chinese Patent Appl. No. 2007101521097, dated Mar. 17, 2014.

\* cited by examiner

FIG. 7
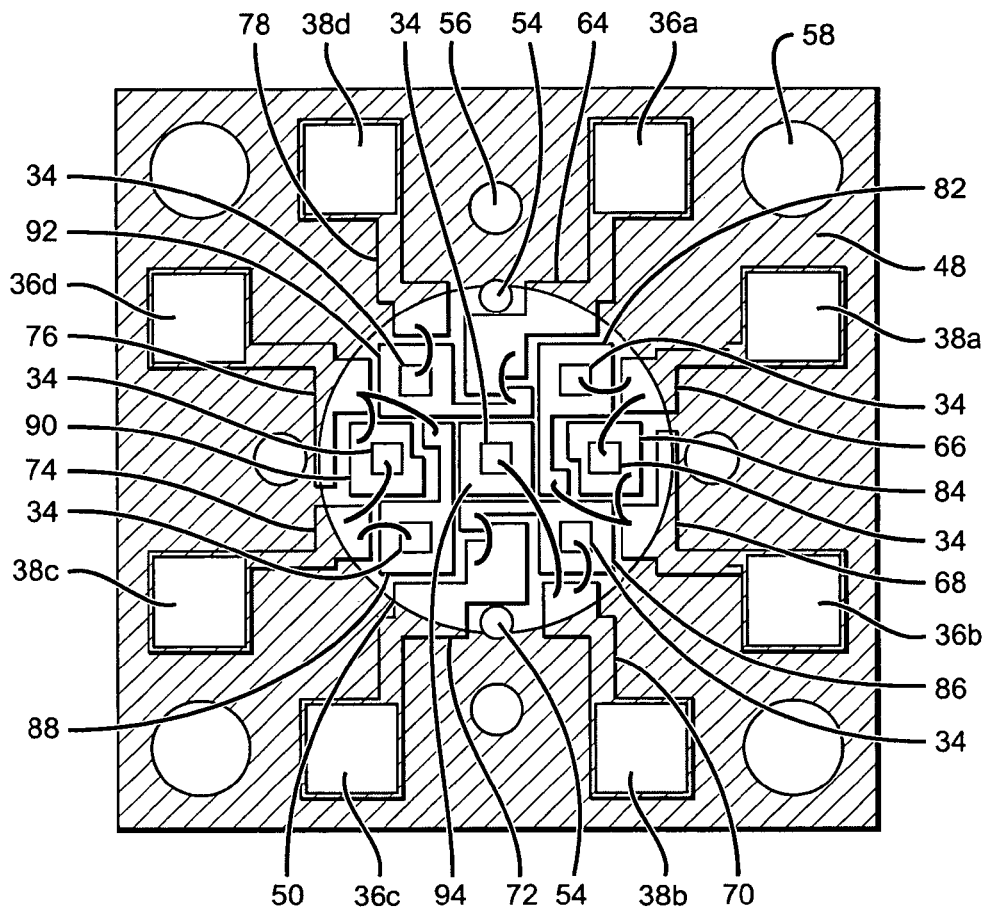
FIG. 8
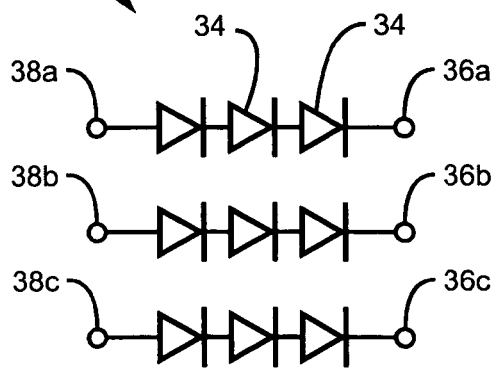
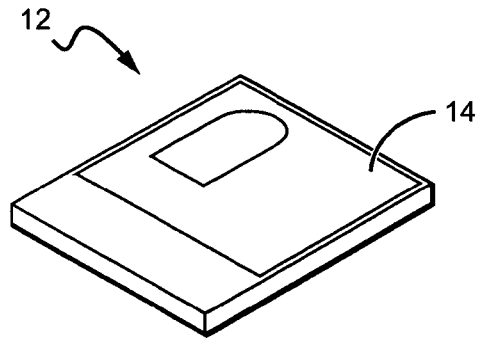
FIG. 13

MULTI-CHIP LIGHT EMITTING DIODE MODULES

BACKGROUND OF THE INVENTION

1. Field of the Invention

The present invention relates generally to electronic packaging, and more particularly to multi-chip modules ("MCMs" or "MCM") for light emitting devices such as light emitting diodes ("LEDs") and the like.

2. Description of the Related Art

With the advent of LEDs and other light emitting devices of increased brightness and color fidelity, multi-chip lighting modules have become available to further increase luminous flux output. MCMs for lighting typically comprise a single package with a plurality of LEDs, although it is understood that other light emitting devices may be used. Since these MCMs comprise a plurality of light emitting devices, they generally allow for high output of light emission. However, a common problem with light emitting devices such as LEDs is the emitted light from the device chip is largely non-directional and non-uniform, which can negatively impact the emission and optical efficiency of a MCM.

In an attempt to combat this problem, U.S. Patent No. 2004/0080939 discloses a light emitting device with multiple light sources generally mounted on a substrate. Pads of conductive and reflective materials are mounted on the substrate, with the reflective materials used to improve the emission properties of the multiple light sources. A lens is also provided to cover the light sources, which aims to further improve the emission properties of the multiple light sources. However, for some of these devices the overall efficiency may be compromised since some of the light emitted from the multiple light sources can be absorbed is different device structure such as the substrate and spaces between the conductive and reflective pads.

International Patent No. WO 2006/054228 attempts to solve the efficiency problem of multiple-chip lighting modules by providing a substantially continuous reflective layer so less light is absorbed into structures such as the substrate or into the spaces between conductive and/or reflective regions. However, it is well-known that multi-chip modules and many other types of electronic packages, whether containing integrated circuits or discrete components such as diodes or power transistors, discharge sufficient heat to require thermal management. The objective of thermal management in the design of electronic packaging is to maintain the operating temperature of the active circuit or junction side of the component low enough (for example, 110° C. or below) to prevent premature component failure. Various cooling strategies including conduction heat transfer are in common use. One conventional way of implementing conduction heat transfer for dissipating heat in an electronic package is to allow the heat to conduct away along the leads of the device. However, the leads often do not have sufficient mass or exposed surface area to provide effective heat dissipation. For example, high intensity light emitting diodes (LEDs) that emit light principally in the visible part of the electromagnetic spectrum can generate significant amounts of heat that are difficult to dissipate using such conventional techniques.

The devices of both U.S. Patent No. 2004/0080939 and International Patent No. WO 2006/054228 generate sufficient heat to require thermal management. The conductive layers provided in both devices are generally insufficient to handle the necessary thermal management to prevent premature component degradation or failure, and additional means of heat dissipation, such as heat sinks, are required. Heat sinks, however, generally take up space and increase the thickness of such devices, which can be problematic in applications in which space is at a premium.

SUMMARY OF THE INVENTION

The present invention provides systems and apparatuses for multi-chip lighting modules which allow for increased luminous flux output and heat dissipation in a customizable, compact package of lower cost and complexity. One embodiment comprises a multi-chip module device comprising a thermally dissipative substrate. A plurality of light emitting devices is included, and an electrically conductive layer is applied to a surface of the substrate. The conductive layer comprises a plurality of chip carrier parts each having a surface for carrying at least one of the light emitting devices. A reflective layer is also included that at least partially covers the conductive layer.

Pursuant to another specific, exemplary embodiment, a lead frame for a multi-chip module is provided. The lead frame comprises a plurality of electrically conductive light emitting device chip carrier parts, with each of the carrier parts having a surface carrying at least one light emitting device. Each light emitting device comprises a first electrical terminal and a second electrical terminal, with the first terminal of each of the light emitting devices being electrically coupled to the chip carrying surface of the chip carrier part. A plurality of electrically conductive connection parts is provided that is separate from the chip carrier parts, with each of the connection parts having at least one connection pad. The second terminal of each of the light emitting devices is electrically coupled to at least one of the connection pads of a corresponding one of the chip carrier parts or connection parts.

In accordance with yet another specific, exemplary embodiment, a method is provided for producing a multi-chip lighting module device. The method comprises providing a thermally dissipative substrate, and depositing an insulating layer on a surface of the substrate. An electrically conductive layer is applied to at least partially cover a surface of the insulating layer. A plurality of light emitting devices is electrically coupled with portions of the electrically conductive layer. A reflective layer is deposited so that it at least partially covers the conductive layer.

These and other further features and advantages of the invention would be apparent to those skilled in the art from the following detailed description, taken together with the accompanying drawings, in which:

BRIEF DESCRIPTION OF THE DRAWINGS

FIG. 7 is a top plan view of the device shown in FIG. 6;

FIG. 8 is a schematic view of one circuit design embodiment of a multi-chip module device;

FIG. 13 is a perspective view of one embodiment of a substrate for a multi-chip module;

DETAILED DESCRIPTION OF THE INVENTION

Figure 1:
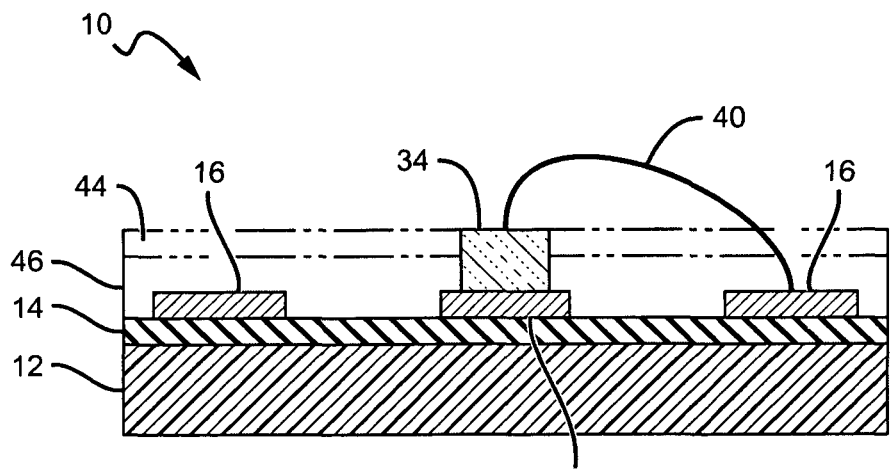
FIG. 1 is a schematic side view of a portion of one embodiment of a multi-chip module device.

The following description presents several possible embodiments. This description is not to be taken in a limiting sense but is made merely for the purpose of describing the general principles of the invention, the scope of which is further understood by the appended claims.

The present invention provides structures for electronic packages for light emitting devices, such as multi-chip LED modules that provide high luminous flux output, as well as improved thermal maintenance via heat dissipation. Several possible embodiments of the present invention are generally directed to multi-chip modules (MCMs) incorporating LEDs, but it is understood that other light emitting devices may also be used.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 2:
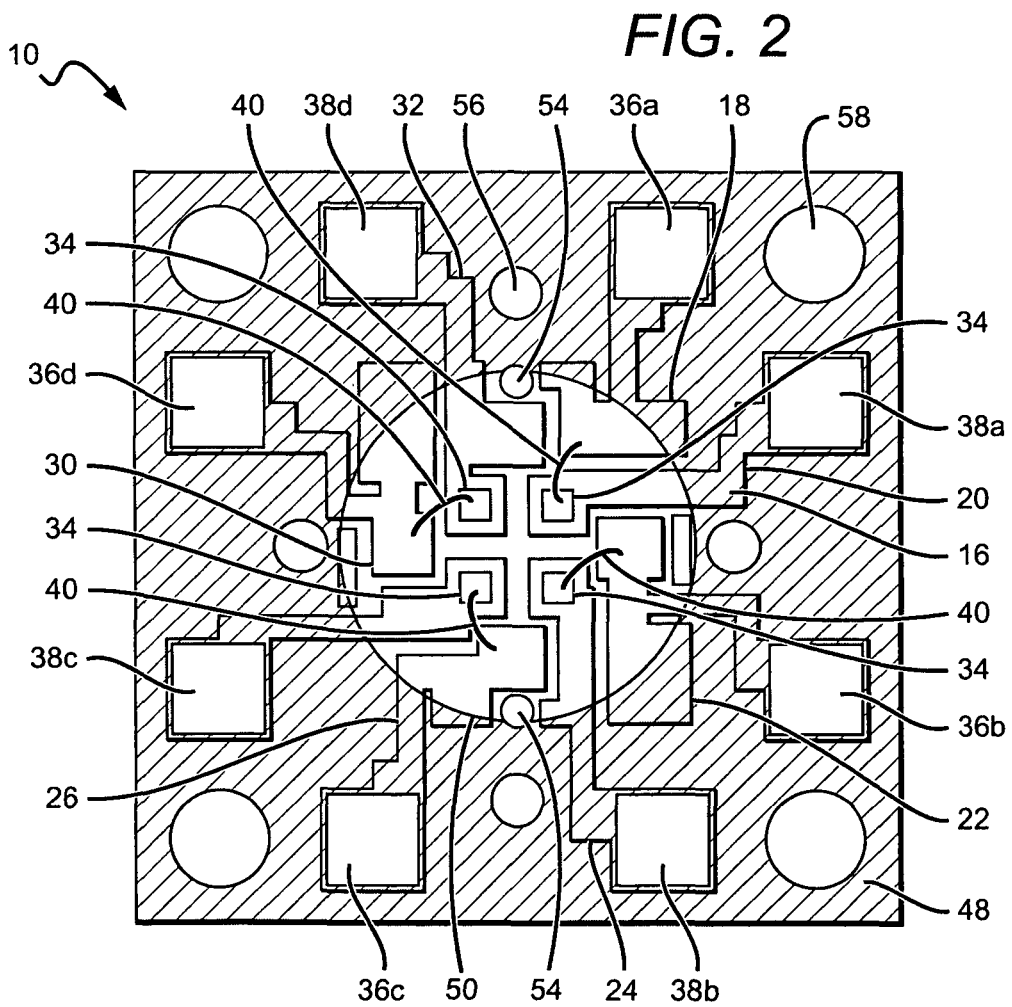
FIG. 2 is a top plan view of the device shown in FIG. 1.

FIGS. 1-2 depict a multi-chip module (MCM) 10 and parts thereof according to specific, exemplary embodiments for use in light emitting devices such as LED displays. The MCM 10 includes a substrate 12, which may be formed from a variety of acceptable elements such as silicon, but is preferably formed of aluminum. The substrate 12 may include an electrically insulating layer 14. Additionally, a circuit layer (such as a printed circuit board) may also be included that can be printed and fired over all or a portion of the top layer of the substrate (shown in FIG. 13). In an embodiment with a circuit layer, the circuit layer may optimize the wire bond process by ensuring there is enough space for wire bonding. Additionally, the circuit layer may be provided to improve the quality of the conductive traces.

In one embodiment, the insulating layer 14 comprises a dark or black material for improved insulation and thermal dissipation, which is preferably screened on the aluminum substrate and then heat is applied to cure the insulating material. The insulating layer material is preferably an epoxy-based protective layer, but it is understood that other suitable materials may also be used. In one embodiment, the use of a black aluminum substrate provides a number of advantages over metal core substrates or traditional substrates with heat sinks. For example, one such advantage includes eliminating the need for heat sinks so a more compact design can be achieved. Additionally, overall assembly costs can be reduced since additional parts, such as a heat sink, are not required. Also, because of the heat-dissipating qualities of a black aluminum substrate, higher reliability can be achieved since fewer heat-induced problems will occur.

The substrate 12 carries a conductive lead frame layer 16 applied on top of the insulating layer 14 and the circuit layer (if provided), with the lead frame 16 comprising a plurality of separate electrically conductive traces, which in this example comprise parts 18, 20, 22, 24, 26, 28, 30, 32 (best shown in FIG. 2). One or more LEDs 34 may be mounted on a portion of at least one of the parts 18, 20, 22, 24, 26, 28, 30, 32. While it is understood that any acceptable light emitting device may be mounted, LEDs constitute part of an exemplary embodiment of MCMs according to the present invention, and by way of example and not limitation, will be discussed hereinafter as the light emitting device used.

The LEDs 34 can have many different semiconductor layers arranged in different ways and can emit many different colors in different embodiments according to the present invention. LED structures, features, and their fabrication and operation are generally known in the art and only briefly discussed herein. The layers of the LEDs 34 can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LEDs 34, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or AlInGaP aluminium Indium Galium Phosphide or ZnO Zinc Oxide.

The growth substrate can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LEDs 34 can also comprise a conductive current spreading structure and wire bond pads on the top surface, both of which are made of a conductive material and be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LEDs 34 with the fingers spaced to enhance current spreading from the pads into the LED's top surface. In operation, an electrical signal is applied to the pads through a wire bond as described below, and the electrical signal spreads through the fingers of the current spreading structure and the top surface into the LEDs 34. Current spreading structures are often used in LEDs where the top surface is p-type, but can also be used for n-type materials.

Some or all of the LEDs 34 can be coated with one or more phosphors, with the phosphors absorbing at least some of the LED light and emitting a different wavelength of light such that the LED emits a combination of light from the LED and the phosphor. The LED chips 48 can be coated with a phosphor using many different methods, with one suitable method being described in U.S. patent application Ser. Nos. 11/656, 759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473, 089 entitled "Close Loop Electrophoretic Deposition of Semiconductor Devices", which is also incorporated herein by reference.

Furthermore, the LEDs 34 may have vertical or lateral geometry as is known in the art. Those comprising a vertical geometry may have a first contact on the substrate 12 and a second contact on a p-type layer. An electrical signal applied to the first contact spreads into the n-type layer and a signal applied to the second contact spreads into the p-type layer 18. In the case of Group-III nitride devices, it is well known that a thin semitransparent current spreading layer typically covers some or all of the p-type layer. It is understood that the second contact can include such a layer, which is typically a metal such as platinum (Pt) or a transparent conductive oxide such as indium tin oxide (ITO).

LEDs 34 may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

The LED(s) 34 may be electrically coupled with parts of the lead frame 16 by means of an electrically and thermally conductive interface such as a solder, adhesive, coating, film, encapsulant, paste, grease and/or other suitable material. In one embodiment, the LEDs may be electrically coupled and secured to the lead frame 16 using a solder pad on the bottom of the LEDs. LEDs may also be flip-chip mounted onto the lead frame 16.

Each of the one or more LEDs 34 has a pair of contacts (also referred to as electrical terminals or electrodes) each of which is electrically coupled to a respective pair of MCM chip cathodes 36a-d and anodes 38a-d (see FIG. 2). In accordance with a typical implementation of the embodiments shown, each of the one or more LEDs 34 are mounted to and one of its contacts is electrically coupled to a respective one of the die attach pads 20, 24, 28, 32, which are part of the lead frame 16. A respective one of the cathodes 36a-d is electrically connected to a respective one of the die attach pads 20, 24, 28, 32 by the lead frame 16 so that when a signal is applied to one of the cathodes the signal is conducted to its die attach pad and to contact of its one of the LEDs 34. Each of the other contacts of the LEDs are electrically coupled to a respective one the connector parts 18, 22, 26, 30 of the lead frame 16 such as by wire bonds 40. Each of the connector parts 18, 22, 26, 28 is electrically connected to a respective one of the anodes 38a-d.

By way of example and not limitation, FIG. 2 shows four LEDs 34 mounted on attach pads 20, 24, 28, 32 respectively, with wire-bonds 40 electrically connecting LEDs 34 to parts 18, 22, 26, 30 respectively. Electrical signals applied across corresponding cathodes 36a-d and anodes 38a-d are conducted through the lead frame causing the LEDs to emit light. For example, electrical signals applied across cathode 36a and anode 38a are conducted to the LED 34 mounted to attach pad 20, causing the LED to emit light. Electrical signals applied to the other cathode and anode pairs cause the others of the LEDs to emit light.

It is understood that less than or more than four LEDs 34 may be mounted to lead frame 16. For example, two LEDs 34 may be mounted to each of attach pads 20, 24, 28, 32 and then separately wire-bonded to each of parts 18, 22, 26, 30. In still other embodiments, the LEDs 34 may be mounted to parts 18, 22, 26, 30 and wire-bonded to attach pads 20, 24, 28, 32.

Figure 3:
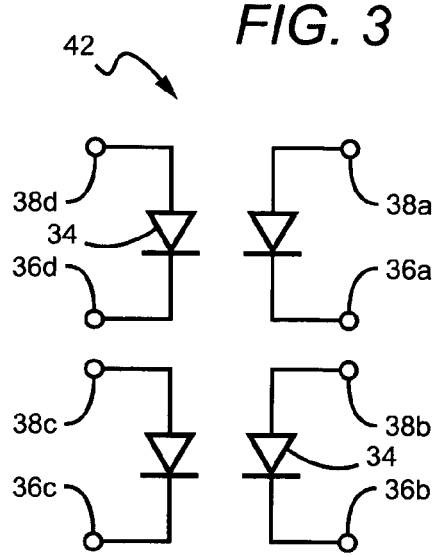
FIG. 3 is a schematic view of one circuit design embodiment of the device of FIG. 2.
Figure 4:
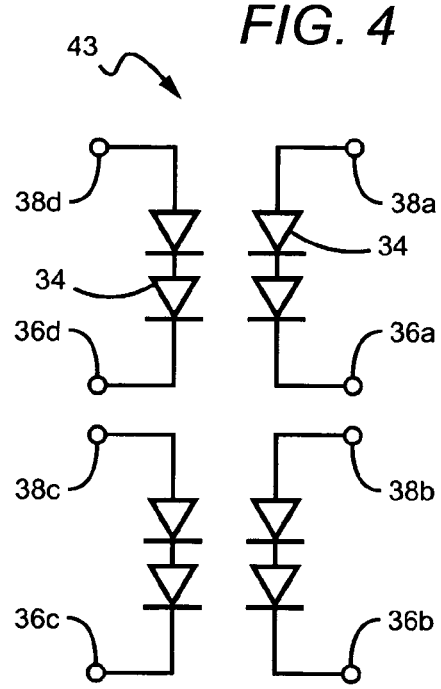
FIG. 4 is a schematic view of another circuit design embodiment of a multi-chip module device.

FIG. 3 is a circuit schematic 42 for the MCM 10 depicted in FIG. 2, showing interconnection of the LEDs from each of the anodes 38a-d to each of said cathodes, 36a-d. FIG. 3 depicts interconnections as if one LED 34 is electrically connected to each anode 38 and cathode 36 pair, but it is understood that more than one LED 34 may be electrically connected to each pair. For example, FIG. 4 is another embodiment of a circuit schematic 43 showing another interconnection scheme for LED 34 in an MCM according to the present invention. Two LEDs 34 are electrically connected in series between each of each of anodes 38a-d and cathodes 36a-d. This interconnection could be accomplished by mounting LEDs to attach pads 20, 24, 28, 32 and also mounting LED to the parts 18, 22, 26, 30, with a wire bonds therebetween to interconnect the LEDs between the anodes 38a-d and cathodes 36a-d as shown.

As in any arrangement according to embodiments of the present invention, any color or color combinations of LEDs may be used to produce a variety of desired effects. Additionally, various anode/cathode pairs may be activated and/or deactivated at any desired time for a variety of varying color effects, combinations, and light intensities. In one embodiment, the LEDs 34 can comprise white emitting LEDs with the desired wavelength of light and the desired color temperature, or the LEDs can comprise different LEDs emitting different colors of light that combine to the desired wavelength of light and the desired color temperature. In both arrangements the MCM 10 can emit white light.

Figure 5:
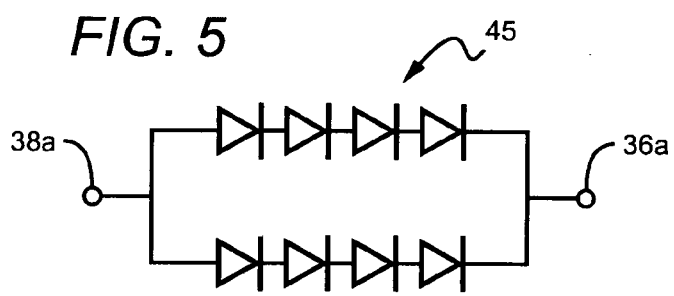
FIG. 5 is a schematic view of another circuit design embodiment of a multi-chip module device.

It is understood that in different embodiment less than all of the anodes 38a-d and cathodes 36a-d can be used, largely dependent upon the number of LEDs 34 used and how the LEDs 34 are interconnected. FIG. 5 is yet another embodiment of a circuit schematic 45, depicting current flow between only anode 38a and cathode 36a with eight LEDs 34 electrically connected there between. The LEDs 34 comprise two groups of four serially connected LEDs 34, with the two groups connected in parallel between anode 38a and cathode 36a. An electrical signal applied to anode 38a and 36b causes all the LEDs 34 to emit light.

In one embodiment, the cathodes 36, anodes 38, lead frame 16, and spaces between the lead frame parts 18, 20, 22, 24, 26, 28, 30, 32 may all be further coated with a reflective layer 44 to improve reflection of light emitted by the LEDs 34 by reflecting light from the LEDs that would have otherwise been absorbed back into the substrate. The reflective layer 44 preferably comprises Ag and is preferably ~15 µm thick, but it is understood that other reflective materials such as Al may be provided at a variety of thicknesses. The reflective layer 44 may completely or partially cover portions of the lead frame 16 not occupied by LEDs 34 or wire bonds 40 (with possible partial coverage depicted by the dashed lines in FIG. 1), but it is understood that as more area is covered by reflective layer 44, a larger reflective area is obtained, which can improve the overall reflectivity of the MCM. Additionally, if a circuit layer is provided on insulating layer 14, the reflective properties of the layer may further aid in improving the overall reflectivity of the device.

Underneath reflective layer 44, an isolating layer 46 may be deposited to at least partially cover the substrate 12, insulating layer 14, and possibly portions of lead frame 16 not occupied by LEDs 34 or wire bonds 40, with possible partial coverage over the lead frame 16 depicted by the dashed lines in FIG. 1. The insulating layer may be provided to prevent any short-circuiting between the reflective layer 44 and conductive lead frame 16. If the isolating layer 46 is provided to substantially cover the lead frame 16, holes may be provided in the layer 46 to allow for connectivity between LEDs 34 and portions of the traces of lead frame 16.

Further, a protective layer 48 (depicted by the diagonal lines in FIG. 2), preferably white or lighter in color, may be provided. In one embodiment, such a protective layer 48 may be provided in lieu of the reflective layer 44. Alternatively, the protective layer 48 may be provided in combination with a reflective layer 44 or the reflective layer 44 may be provided without said protective layer 48. The protective layer 48 may be fabricated of material that is preferably both electrically insulating and thermally conductive. Such materials are well-known in the art and may include, without limitation, certain ceramics, resins, epoxies, thermoplastic polycondensates (e.g., a polyphthalamide (PPA)), oxide compounds, and glass. In one embodiment, the protective layer is comprised of a mixture of epoxy and an oxide compound (e.g. $MgO$, $TiO_2$), and may be ~25±1 µm thick, though it is understood that the preferred thickness will depend on the material used. The protective layer 48 may further aid in the reflectivity of the device by allowing emitted light that would otherwise be reabsorbed into the substrate of the device to be reflected from its white or lighter surface. The protective layer 48 will preferably not cover the cathodes 36a-d, anodes 38a-d, and several through-holes as will be discussed below. Additionally, a cavity or opening 50 may be provided in the middle of the lead frame 16 structure, which is also preferably not covered by said protective layer 48. Allowing the protective layer to cover the LEDs 34 and/or the wire bond surfaces would be disadvantageous as it would hinder light from emanating from the LEDs.

In some embodiments, the cavity 50 may be at least partially filled with a fill material. The fill material can protect and positionally stabilize the lead frame 16 and the LEDs 34 carried thereon. In some instances, the fill material may cover the LEDs 34, the parts 18, 20, 22, 24, 26, 28, 30, 32 of the lead frame 16 exposed through the cavity 50, the LEDs' electrical connections, and the reflective layer 44 and isolating layer 46. The fill material may be selected to have predetermined optical properties so as to further enhance the light extraction from the LEDs 34, or to obtain the desired emission pattern, direction or beam shape. The fill material may be formed from a resin, an epoxy, a thermoplastic polycondensate, glass, and/or other suitable materials or combinations of materials. In some embodiments, materials may be added to or the surface may be roughened of the fill material to enhance the emission, absorption and/or dispersion of light to and/or from the LEDs 34.

Figure 14:
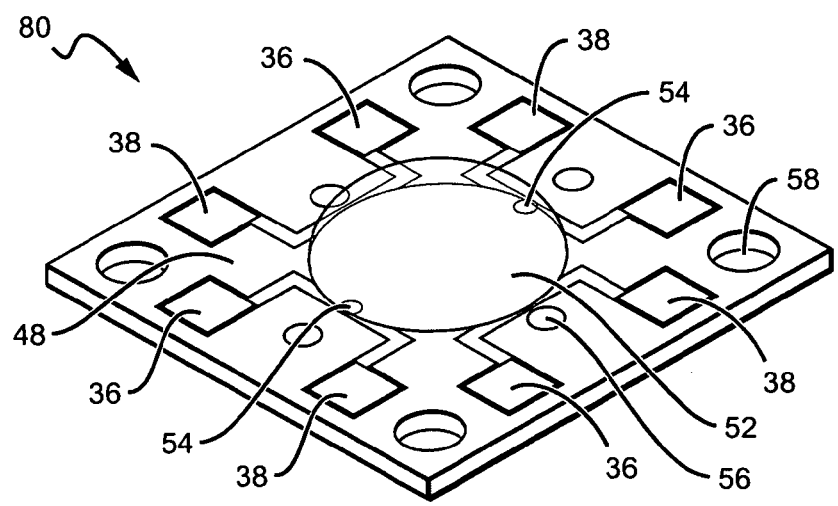
FIG. 14 is a perspective view of one embodiment of a multi-chip module.

In addition to or instead of a fill material, an optical element such as a lens 52 (best shown in FIG. 14) or a collimator (not shown) may be incorporated. As shown in the depiction of an actual MCM 80 in FIG. 14, a lens is placed over the cavity 50, and is seated in place via holes 54. The lens 50 may be separately formed or molded from the rest of MCM 10 using injection molding or another appropriate process, and then later attached to the device via holes 54. Alternatively, the lens may be molded over the top of the MCM using known methods, such as overmolding methods.

The lens 52 can be formed over the LEDs 34 using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 52 can also be textured to improve light extraction or can contain materials such as phosphors or scattering particles.

The lens arrangement is also easily adapted for use with secondary lens or optics that can be included over the lens by the end user to facilitate beam shaping. These secondary lenses are generally known in the art, with many different ones being commercially available. The lens 52 can also have different features to diffuse or scatter light, such as scattering particles or structures. Particles made from different materials can be used such as titanium dioxide, alumina, silicon carbide, gallium nitride, or glass micro spheres, with the particles dispersed within the lens. Alternatively, or in combination with the scattering particles, air bubbles or an immiscible mixture of polymers having a different index of refraction could be provided within the lens or structured on the lens to provide diffusion. The scattering particles or structures can be dispersed homogeneously throughout the lens 52 or can have different concentrations in different areas of the lens. In one embodiment, the scattering particles can be in layers within the lens, or can have different concentrations in relation to the location of the LEDs 34 emitting different colors of in the array.

The MCM 10, 60, 80 can have many different shapes and sizes, and may be generally square or rectangular. The MCM 10, 60, 80 may also include sets of through-holes 56, 58, which may be provided to allow for better and shorter contact for the MCM body to a PCB or other base structure or may also allow for improved thermal dissipation.

Figure 12:
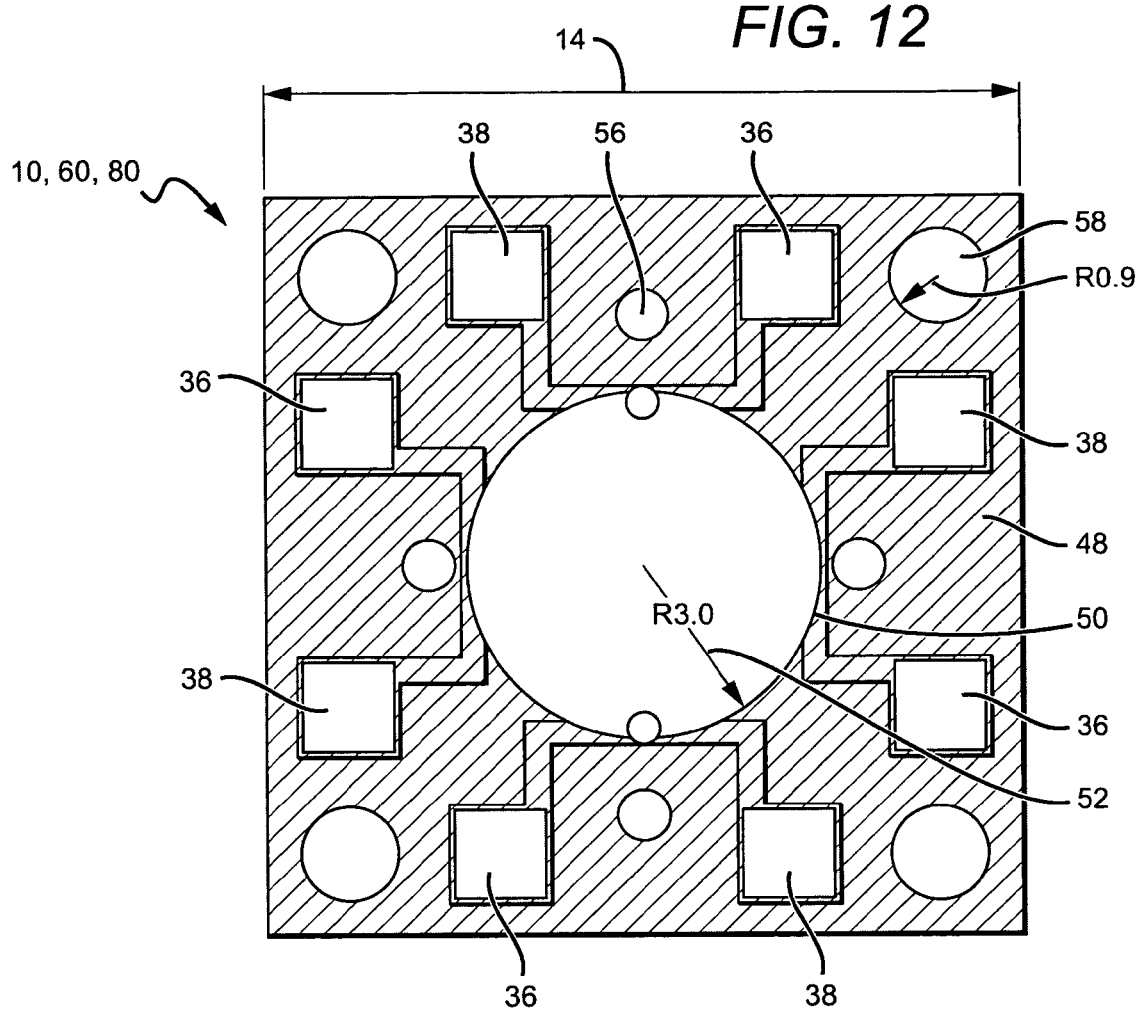
FIG. 12 is a top dimensional view of one embodiment of a multi-chip module.

By way of example and not limitation, and as best shown in FIG. 12, the MCM 10, 60, 80 may have an overall length of ~14.0 mm±0.05 mm and an overall width of ~14.0 mm±0.05 mm. The larger through-holes 58 may have a radius of ~0.9 mm, and the lens 52 may have a radius of ~3.0 mm. Each of the cathodes 36*a-d* and anodes 38*a-d* may have a width of ~1.8 mm.

The MCM 10, 60, 80 may house any number and color combination of LEDs 34. They may individually or collectively emit red, green, blue, white, other colors, or any combination thereof. When appropriately energized, the LEDs 34 may produce a substantially full range of colors.

The lead frame 16 is adapted to be disposed in a heat transfer relationship with a heat spreader or dissipator carried by substrate 12, such as printed wiring or a circuit board. The thermally conductive aluminum substrate 12 with its electrically insulating black layer 14 can serve as an efficient heat dissipator providing low thermal resistance between the heat-generating LEDs 34 carried by the lead frame 16 and in contact with a circuit board. Heat is also dissipated along the lead frame 16.

The lead frame 16 may be made from an electrically conductive metal or metal alloy, such as copper, a copper alloy, sheet metal, sheet metal alloy, and/or other suitable low resistivity, corrosion resistant materials or combinations of materials. As noted, the thermal conductivity of the lead frame 16 may assist, to some extent, in conducting heat away from the LEDs 34, with the aluminum substrate 12 further aiding in heat dissipation such that an additional heat sink is not required.

Figure 6:
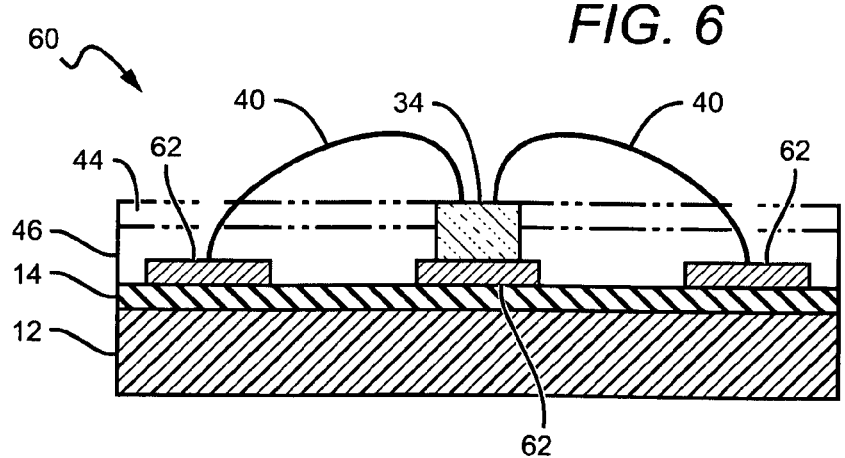
FIG. 6 is a schematic side view of a portion of another embodiment of a multi-chip module device.

FIGS. 6-11 show a MCM 60 and various possible circuit schematics according to other specific, exemplary embodiments for use, by way of example, in an LED display. The MCM 60 of FIGS. 6-7 is similar in many respects to the MCM 10 shown in FIGS. 1-2 and for the similar features the same reference number from FIGS. 1-2 are used herein. The MCM 60 comprises a different lead from lead frame 62 compared to that in MCM 10. The MCM 60 of FIGS. 6-7 comprises a preferably aluminum substrate 12 comprising a preferably black insulating layer 14. The substrate 12 carries a conductive lead frame layer 62 applied on top of the insulating layer 14, with the lead frame 62 in this example comprising a plurality of electrically conductive traces 64, 66, 68, 70, 72, 74, 76, 78, and a plurality of separated connective parts 82, 84, 86, 88, 90, 92, 94 (best shown in FIG. 7*g*).

One or more LEDs 34 may be mounted on a portion of at least one of the traces 64, 66, 68, 70, 72, 74, 76, 78 and/or at least one of the connective parts 82, 84, 86, 88, 90, 92, 94, which can then be electrically connected to at least one of the other said trace and/or said connective parts to create a current flow between the two electrical terminals for each LED 34 (see examples in FIG. 7). Wire bonds 40 may be used to electrically connect LEDs 34 from one of said traces to one of said connective parts, from one of said connective parts to another of said connective parts, or from one of said traces to another one of said traces. It is understood that any combination of LEDs 34, traces and connective parts may be electrically connected.

Each of the one or more LEDs 34 has a respective cathode 36 and anode 38 as described above. By way of example and not limitation, FIG. 7 shows a plurality of LEDs 34 mounted on various traces and connective parts, with wire-bonds 40 electrically connecting LEDs 34 to adjacent traces and/or connective parts. However, it is understood that any reasonable number and combination of LEDs 34 may be mounted to the various components of lead frame 62.

Figure 9:
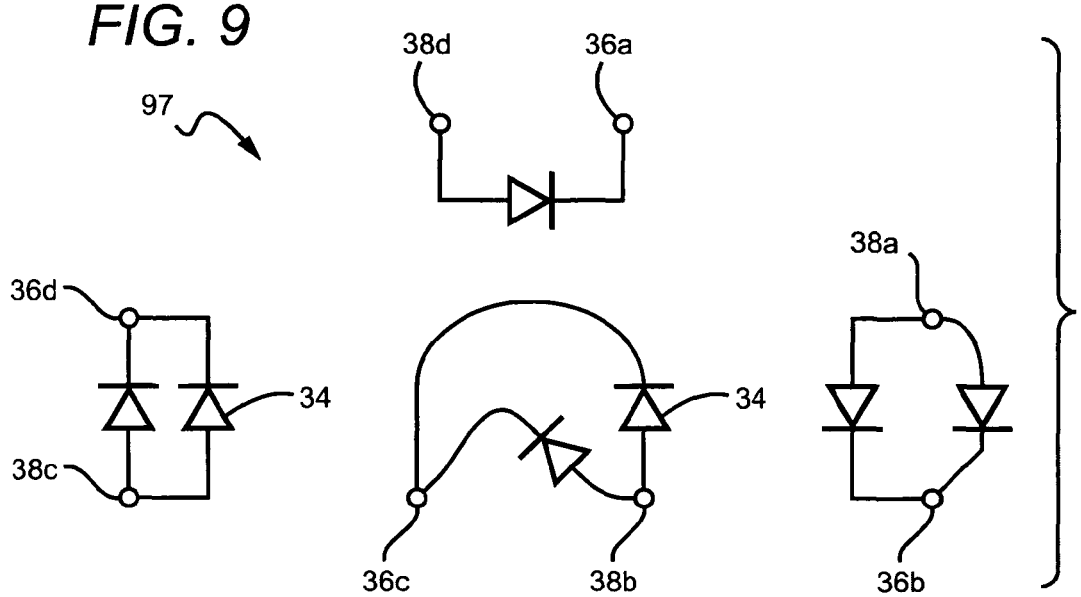
FIG. 9 is a schematic view of one circuit design embodiment of the device of FIG. 7.
Figure 10:
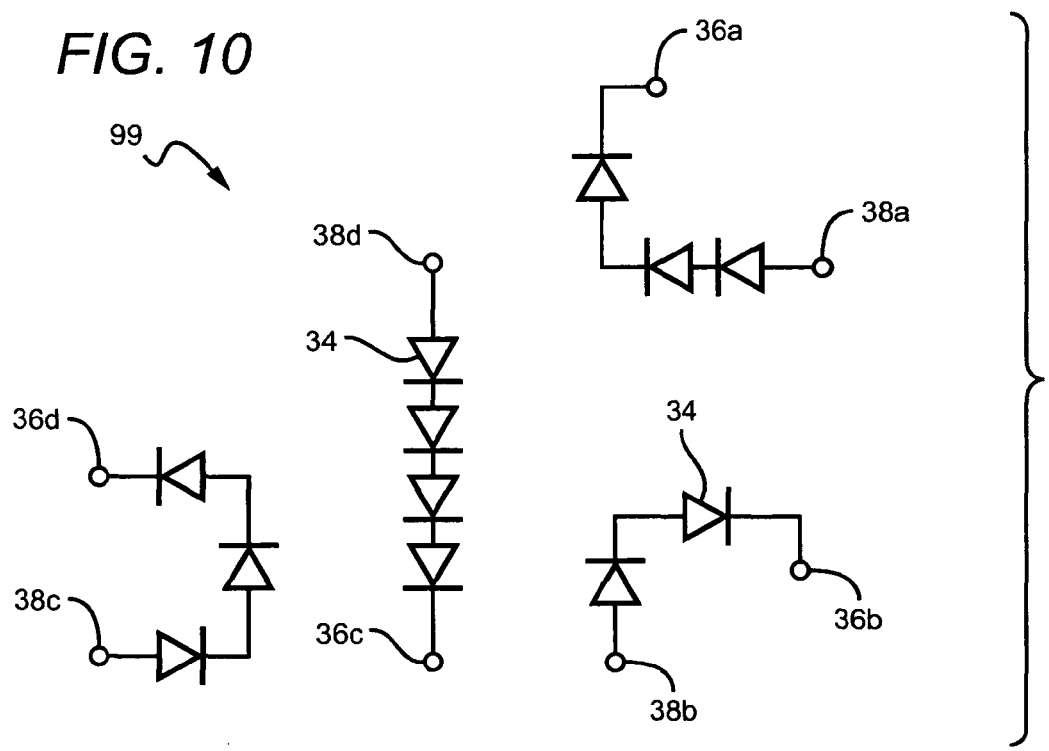
FIG. 10 is another schematic view of one circuit design embodiment of a multi-chip module device.
Figure 11:
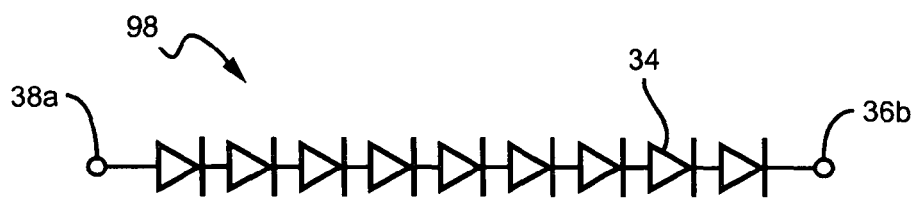
FIG. 11 is another schematic view of one circuit design embodiment of a multi-chip module device.

For example, FIG. 8 is a circuit schematic 96 of one possible embodiment for a serial circuit design based on the MCM 60 of FIG. 5, showing current flow paths from three of said anodes 38 to three of said cathodes 36. Schematic 96 depicts current flow from anodes 38*a-c* to their respective cathodes 36*a-c* as if three LEDs 34 are electrically connected to each pair. FIG. 9 is a circuit schematic 97 of the circuit design depicted in FIG. 7, showing paths from each of anodes 38*a-d* to another of cathodes 36*a-d*. FIG. 10 is yet another embodiment of a circuit schematic 99, depicting another current flow arrangement between anodes 38*a-d* and another of cathodes 36*a-d*. FIG. 11 is a circuit schematic 98 depicting the current flow paths if nine LEDs 34 were connected in series from anode 38*a* to cathode 36*b*. While the above circuit schematics illustrate a variety of various possible arrangements, it is understood that any number of varying serial and parallel arrangements/combinations and one or all of the bond pads may be used in accordance with the present invention. These different arrangements can have LEDs mounted in different locations with different wire bond arrangement to achieve the desired interconnections.

The cathodes 36, anodes 38, lead frame 62, and spaces between the lead frame traces and connective parts may all be coated with reflective layer 44 to improve reflection of light emitted by the LEDs 34 as described above. The reflective layer 44 may completely or partially cover portions of the lead frame 62 not occupied by LEDs 34 or wire bonds 40, but it is understood that as more area is covered by reflective layer 44, a larger reflective area is obtained, which can improve the overall reflectivity of the MCM. Underneath reflective layer 44, isolating layer 46 may be deposited to at least partially cover the substrate 12, insulating layer 14, and lead frame 62.

Substantially all other elements as included in the embodiment of FIGS. 1-2 may also be included in the embodiment of FIGS. 6-7.

Figure 15:
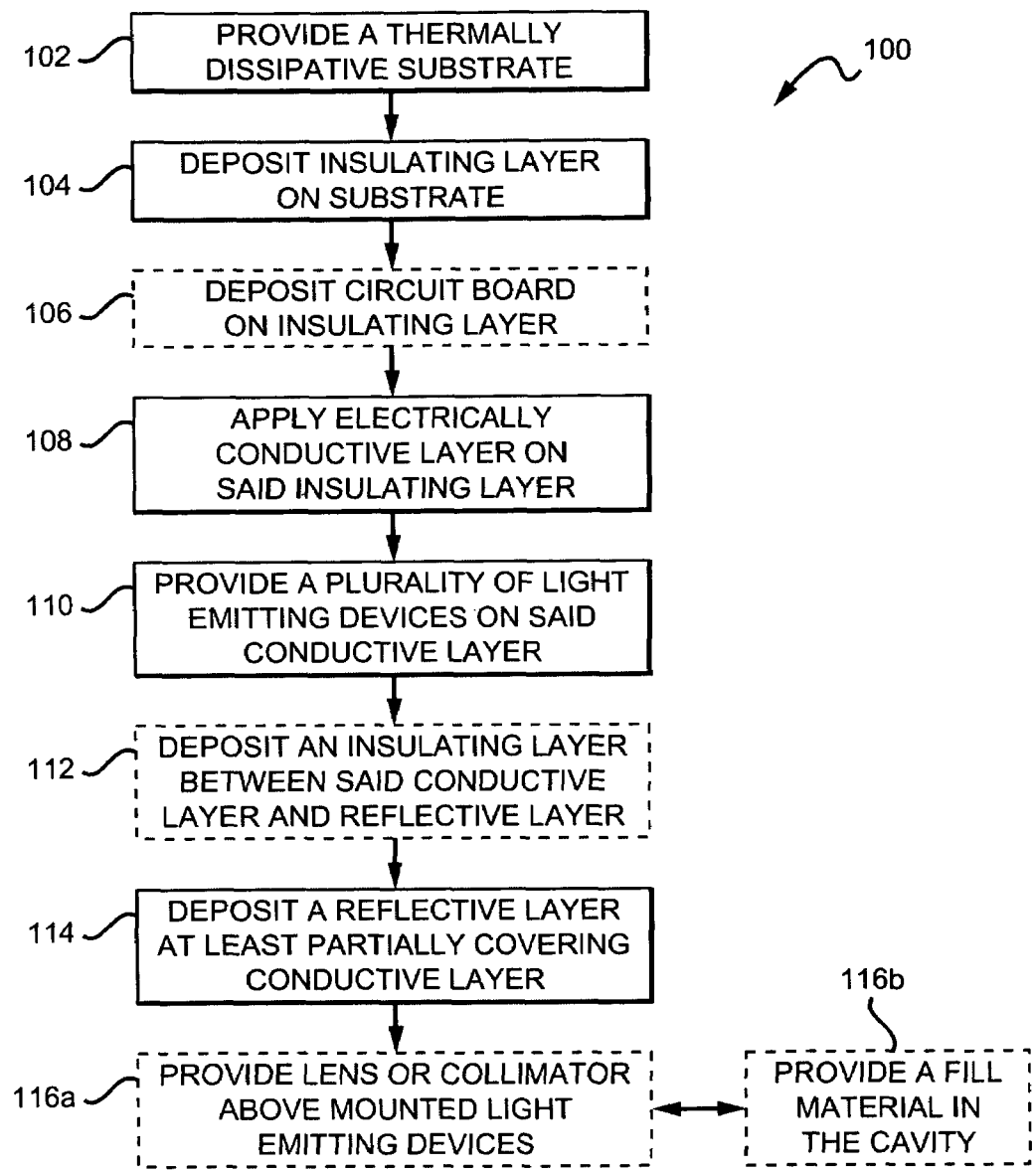
FIG. 15 is a schematic view of a method for producing a multi-chip module.

With reference now to FIG. 15, a method 100 for forming MCMs according to possible embodiments is shown. Optional steps are illustrated by boxes with broken lines. First, in step 102, a thermally dissipative substrate is provided that may be formed from a variety of acceptable materials, with a preferred element being aluminum as described above. Then, in the second step 104, an insulating layer is deposited on substantially all of the top surface of the substrate, with the insulating layer preferably comprising a dark or black material. In optional step 106, a circuit layer such as a printed circuit board may be printed and fired on the top of the insulating layer.

In step 108, an electrically conductive layer is applied on the insulating layer such that the insulating layer is at least partially covered, with the conductive layer comprising a lead frame. The lead frame is preferably comprised of an electrically conductive metal or metal alloy, such as copper, a copper alloy, sheet metal, sheet metal alloy, and/or other suitable low resistivity, corrosion resistant materials or combinations of materials, and is preferably thermally conductive as well to assist in the overall thermal management of the MCM. In step 110, a plurality of light emitting devices is provided on various carrier portions of the lead frame. The light emitting devices are preferably LEDs, although other suitable light emitters such as lasers may be provided. The light emitting devices may be electrically coupled with parts of the lead frame by means of an electrically and thermally conductive interface such as an adhesive, coating, film, encapsulant, paste, grease and/or other suitable material, but in one embodiment they are electrically coupled and secured to the lead frame using a solder pad. The light emitting devices may also be flip-chip mounted onto the lead frame. Wire bonds are preferably incorporated to electrically connect the carrier portions of the lead frame with separate connector portions of the lead frame.

In optional step 112, an isolating layer may be deposited on the insulating layer, substrate, and portions of the conductive layer not occupied by a light emitting device. The isolating layer separates the conductive portions beneath it from a reflective layer deposited in step 114, such that no short-circuiting occurs due to contact of the reflective layer with the conductive layer. If necessary, through-holes may be incorporated in the isolating layer to enable electrical connection of the light emitting devices to the conductive layer. In step 114, the reflective layer is deposited such that it at least partially covers the conductive layer. The reflective layer is designed to maximize the light emitted from the device and minimize the light absorbed into the substrate and other areas of the MCM. In one embodiment, the conductive layer comprises silver, but it is understood that other suitable materials may be used.

A protective layer may also be included that substantially covers the surface of the MCM but for some through-holes and a central portion of the MCM above the mounted light emitting devices. The protective layer is preferably comprised of a light or white substance. In the center portion of the MCM not covered by the protective layer, a sort of cavity is left behind. In one alternative step 116b, a fill material may be used in the cavity which can protect and positionally stabilize the lead frame and the light emitting devices carried thereon. In some instances, the fill material may cover the light emitting devices and their electrical connections, along with portions of the lead frame exposed through the cavity, the reflective layer, and the isolating layer. The fill material may be comprised of materials having optical properties to further enhance light emission. The preferred material(s) is discussed above.

In addition to or instead of the fill material, an optical element such as a lens or a collimator may be provided in step 116a. The optical element is placed over the cavity to further improve the light reflection of the light emitting devices, and in the case of a lens may be seated in place via holes in the MCM. A lens is preferably formed from a glass, but other suitable materials may be used.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A multi-chip module device, comprising:
a substantially thermally dissipative substrate;
a plurality of light emitting devices;
an electrically conductive layer applied to a surface of said substrate, wherein said conductive layer comprises a plurality of chip carrier parts each having a surface for carrying at least one of said light emitting devices;
a reflective coating at least partially between and at least partially surrounding two or more of said light emitting devices and at least partially covering said conductive layer; and
an isolating layer disposed between said reflective coating and said conductive layer, said isolating layer at least partially surrounding two or more of said light emitting devices.

2. The device of claim 1, wherein said substrate comprises a dark insulating layer deposited on a surface of said substrate.

3. The device of claim 2, wherein the substrate further comprises a base layer which comprises Al, and the insulating layer of said substrate is black.

4. The device of claim 2, wherein said substrate further comprises a circuit layer on said substrate, with said circuit layer between said insulating layer and said electrically conductive layer.

5. The device of claim 4, wherein said electrically conductive layer and said circuit layer are in thermal contact to allow for low thermal resistance and heat dissipation.

6. The device of claim 1, wherein said plurality of light emitting devices comprise LEDs.

7. The device of claim 1, wherein each of said light emitting devices is electrically connected to an anode and a cathode.

8. The device of claim 7, wherein said electrically conductive layer further comprises a plurality of connection parts.

9. The device of claim 8, wherein said light emitting devices are electrically and thermally coupled to said chip carrier parts and/or said connection parts via a solder pad or flip-chip mounting.

10. The device of claim 8, wherein said anodes and cathodes are electrically connected to said chip carrier parts and/or said connection parts via wire bonds.

11. The device of claim 7, wherein said anodes are directly electrically and thermally coupled to said chip carrier parts.

12. The device of claim 7, wherein said cathodes are electrically connected to said chip carrier parts via a wire bond.

13. The device of claim 1, wherein said reflective coating covers portions of said electrically conductive layer not occupied by light emitting devices and wire bonds.

14. The device of claim 1, wherein said isolating layer at least partially covers said substrate and said electrically conductive layer, wherein said isolating layer comprises holes to allow for connectivity between said light emitting devices and said electrically conductive layer.

15. The device of claim 1, wherein an electrically insulating and thermally conductive protective layer is at least partially deposited on said electrically conductive layer and said reflective layer, wherein a cavity is formed in said protective layer.

16. The device of claim 1, wherein a lens or collimator is provided above said light emitting devices.

17. The device of claim 1, wherein said light emitting devices emit red, green, blue, white, and/or any combination thereof.

18. The device of claim 1, wherein said electrically conductive layer is made of an electrically conductive metal or metal alloy such as copper, copper alloy, sheet metal, and/or a sheet metal alloy.

19. A single lead frame structure for a multi-chip module, the lead frame comprising:
- a plurality of electrically conductive light emitting device chip carrier parts, with each of said carrier parts having a surface carrying at least one light emitting device, each light emitting device having a first electrical terminal and a second electrical terminal, the first terminal of each of said light emitting devices being electrically coupled to said chip carrying surface of said chip carrier part;
- a plurality of electrically conductive connection parts separate from said chip carrier parts, each of said connection parts having at least one connection pad;
- the second terminal of each of said light emitting devices being electrically coupled to at least one of said connection pads of a corresponding one of said chip carrier parts or one of said connection parts;
- a reflective coating at least partially between and at least partially surrounding two or more of said light emitting devices and at least partially covering said carrier parts; and
- an isolating layer disposed between said reflective layer and said carrier parts, said isolating layer at least partially between and at least partially surrounding two or more of said light emitting devices.

20. A method for producing a multi-chip lighting module device, said method comprising:
- providing a thermally dissipative substrate;
- depositing an insulating layer on substantially all of the top surface of said substrate;
- applying an electrically conductive layer at least partially covering a surface of said insulating layer, said conductive layer carrying a plurality of light emitting devices;
- electrically coupling said light emitting devices with portions of said electrically conductive layer;
- depositing an isolating layer at least partially covering said conductive layer, said isolating layer at least partially surrounding two or more of said light emitting devices and
- depositing a reflective coating at least partially over said isolating layer, said reflective coating at least partially between and at least partially surrounding two or more of said light emitting devices and at least partially covering said conductive layer.

21. A multi-chip module device, comprising:
- a substantially thermally dissipative substrate;
- a plurality of light emitting devices;
- an electrically conductive layer applied to a surface of said substrate, wherein said conductive layer comprises a plurality of chip carrier parts each having a surface for carrying at least one of said light emitting devices;
- a reflective coating at least partially between and at least partially surrounding two or more of said light emitting devices and at least partially covering said conductive layer; and
- a protective coating at least partially between and at least partially surrounding two or more of said light emitting devices and at least partially covering said conductive layer.

22. The device of claim 21, wherein said protective coating is also reflective.

23. The device of claim 21, wherein said protective coating is comprised of $TiO_2$.

24. The device of claim 21, further comprising:
- an isolating layer disposed between said reflective coating and said conductive layer, said isolating layer at least partially surrounding two or more of said light emitting devices.

* * * * *